US005850506A

United States Patent [19]

Gordons

[11] Patent Number: 5,850,506

[45] Date of Patent: Dec. 15, 1998

[54] METHOD OF WRITING INFORMATION IN A NON-VOLATILE MEMORY

[75] Inventor: Edouard Gordons, Aubagne, France

[73] Assignee: Gemplus Card International, Gemenos, France

[21] Appl. No.: 556,986

[22] PCT Filed: May 25, 1994

[86] PCT No.: PCT/FR94/00618

§ 371 Date: Nov. 17, 1995

§ 102(e) Date: Nov. 17, 1995

[87] PCT Pub. No.: WO94/28521

PCT Pub. Date: Dec. 8, 1994

[30] Foreign Application Priority Data

May 26, 1993 [FR] France .................................. 93 06323

[51] Int. Cl.[6] ...................................................... G11C 7/00

[52] U.S. Cl. ...................................... 395/182.03; 711/100

[58] Field of Search ......................... 395/182.03, 182.04, 395/182.13, 182.19, 616–622, 613; 707/102, 200, 201, 202, 203, 204, 205, 206; 365/189.01; 711/100, 161, 162, 165

[56] References Cited

U.S. PATENT DOCUMENTS

| | | | |
|---|---|---|---|
| 4,459,658 | 7/1984 | Gabbe et al. | 395/182.04 |
| 5,371,886 | 12/1994 | Britton et al. | 395/618 |

FOREIGN PATENT DOCUMENTS

| | | |
|---|---|---|
| A-0319799 | 6/1989 | European Pat. Off. . |

*Primary Examiner*—Albert Decady
*Attorney, Agent, or Firm*—Nilles & Nilles, S.C.

[57] ABSTRACT

Non-volatile memory cards in which the writing mechanisms are controlled by a microprocessor.

To improve the coherence of the data elements recorded in the non-volatile memory files, the invention proposes to provide for a possibility of grouped control of several write operations (addition, updating or elimination of recordings). The successive operations are performed by the recording, in a non-volatile transaction space (TS), of the data elements corresponding to the state of the memory before each operation (especially former chainings (A7/16) of chained recordings). Then, a command for the comprehensive validation of the N operations, or on the contrary a command for comprehensive invalidation, is carried out, a validation or invalidation of individual operations being not permitted.

17 Claims, 3 Drawing Sheets

ADDITION OF RECORDING

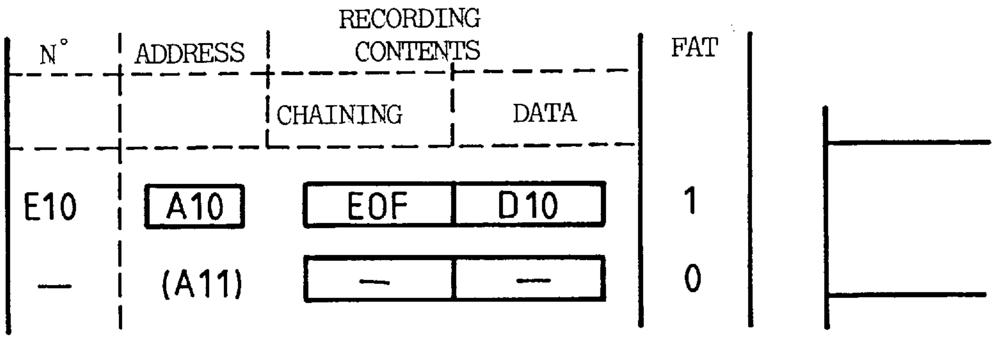
FIG_1a BEFORE ADDITION E11
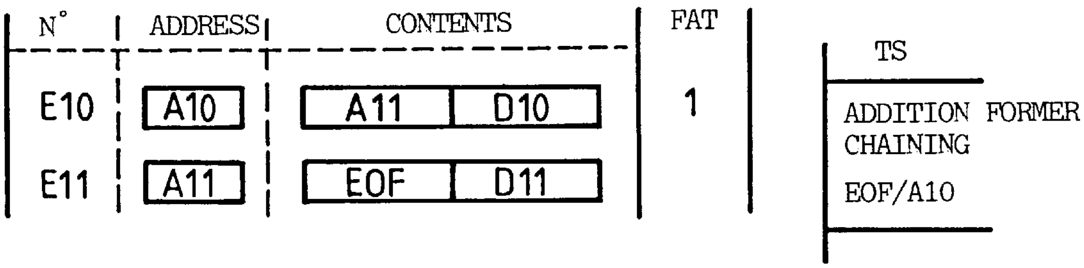
FIG_1b AFTER ADDITION E11
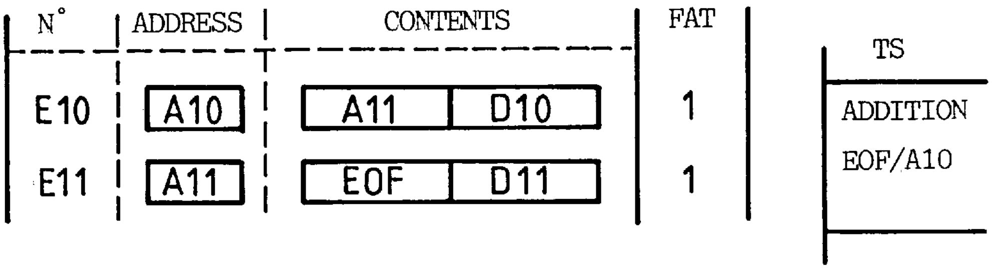
FIG_1c AFTER VALIDATION
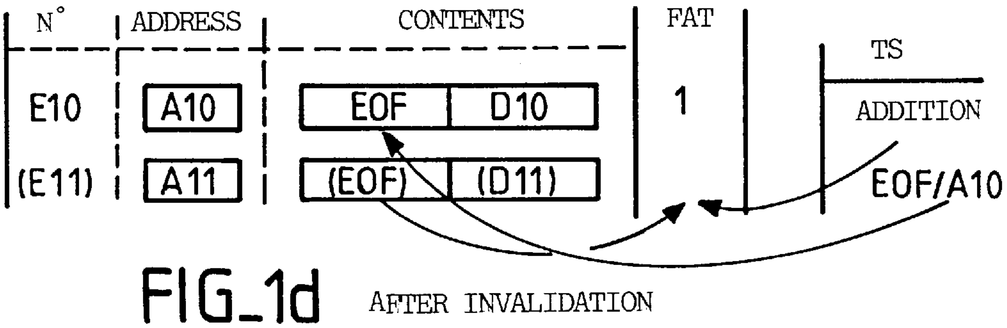
FIG_1d AFTER INVALIDATION
ADDITION OF RECORDING

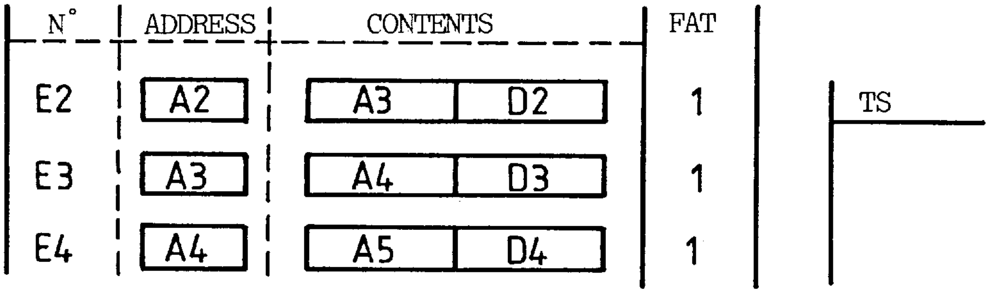
FIG_2a BEFORE ELIMINATION E3
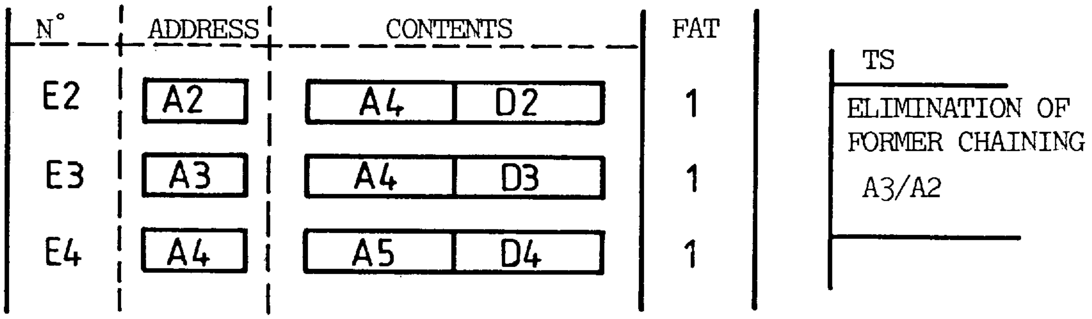
FIG_2b AFTER ELIMINATION E3
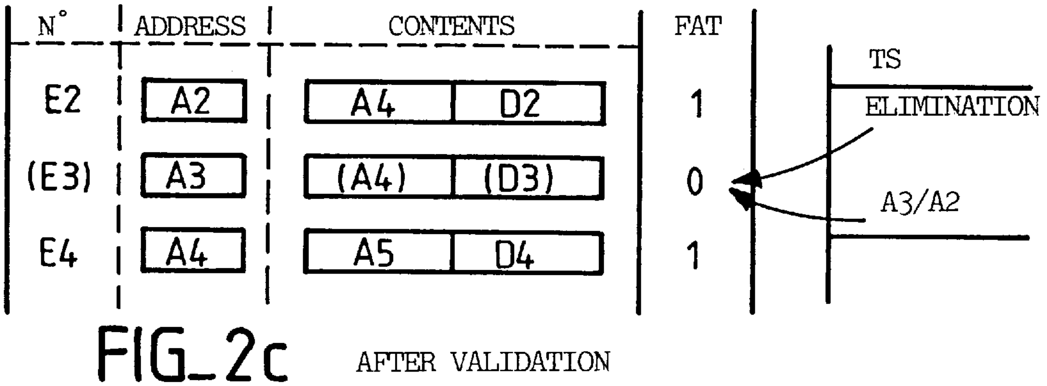
FIG_2c AFTER VALIDATION
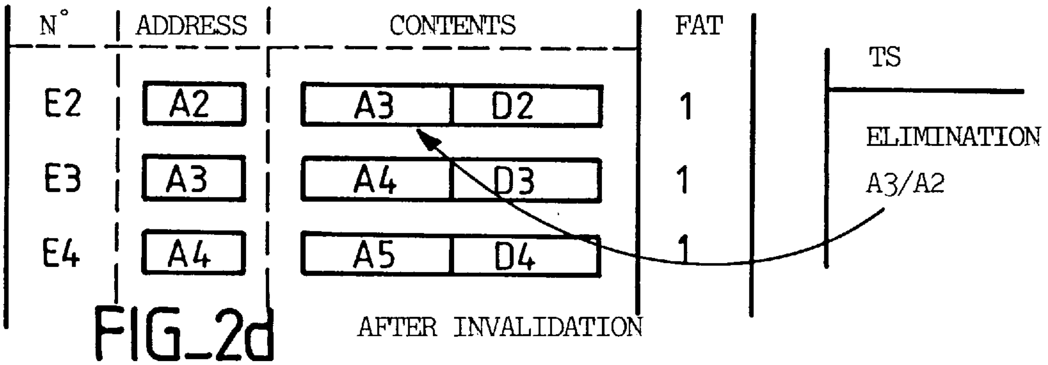
FIG_2d AFTER INVALIDATION
ELIMINATION OF RECORDING

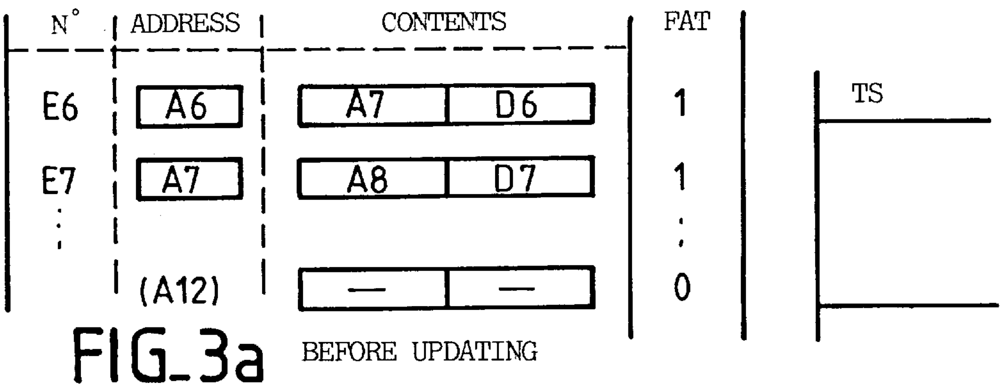
FIG_3a BEFORE UPDATING
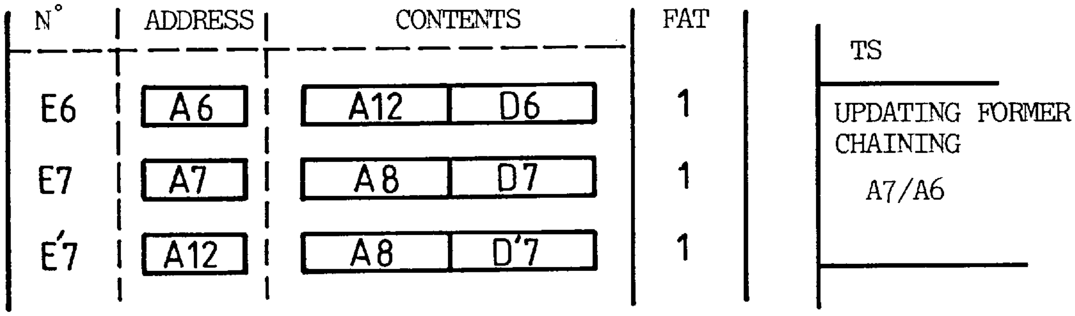
FIG_3b AFTER UPDATING
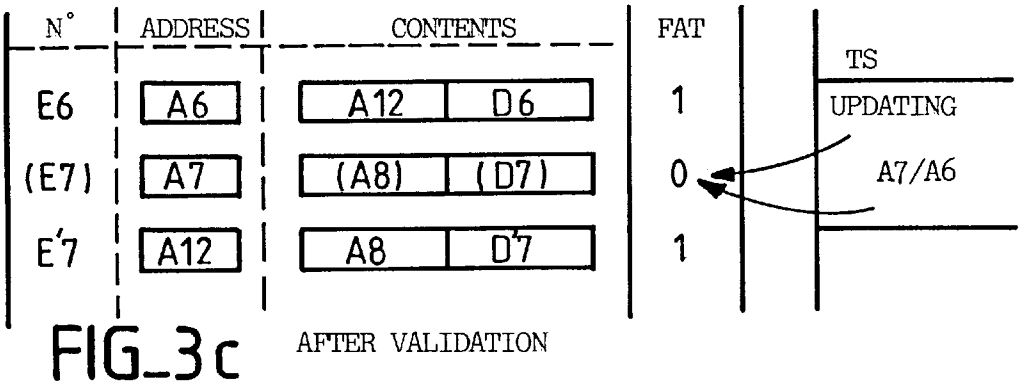
FIG_3c AFTER VALIDATION
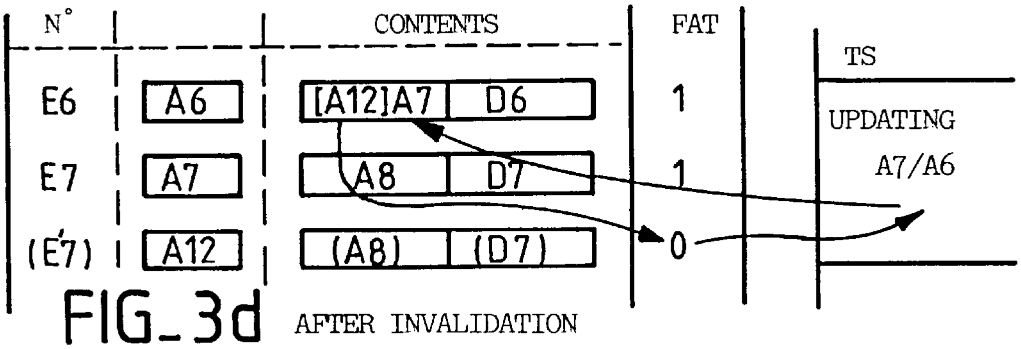
FIG_3d AFTER INVALIDATION
UPDATING OF RECORDING

METHOD OF WRITING INFORMATION IN A NON-VOLATILE MEMORY

BACKGROUND OF THE INVENTION

The invention relates to memory cards, and more particularly to cards containing a non-volatile memory whose contents are managed (for the writing, erasure and updating of recordings) by a microprocessor.

One of the aims proposed by the present invention is to ensure the greater integrity and greater coherence of the data elements recorded in the non-volatile memory of the card.

When novel applications are developed in the form of programs memorized in the card and performed (i.e., executed) by the microprocessor, it is important to ensure that the data elements preserved in the card are coherent and have an unquestionable meaning with respect to their application. The simplest example here is that of cards used as means of payment: if a data element recorded in the card corresponds to a debit or credit amount, it is imperative that there should be no error in this data element.

The data elements recorded in the non-volatile memory of the card are arranged in files according to known methods. The file has recordings and the recordings are placed at specified physical positions of the memory. A file allocation table determines the locations of the memory occupied. The recordings may be chains, namely each recording will have two parts: a data element and an address of the next recording of the file. Within one and the same file, the data elements are, in principle, coherent with one another and in any case it is possible to check the coherence by examining the contents of the file.

But, sometimes, it is also necessary to ensure the coherence of data elements recorded in several different files. This coherence is not easy to ensure in every case of defective operation.

One of the risks in defective operation, for example, is that of the card being wrenched out of the reader during a write operation. There is a risk that the data might be lost. Such problems, related to errors likely to arise during the transmission of information, have been described in the documents FR-A-2 612 316 and EP-A-0 319 799. It has already been attempted to provide for safety procedures (the locking of critical sequences) to avert this risk. The writing is done in two stages and the writing is validated only if it has taken place properly. But if the wrenching takes place during the write operation, then the fact that there has been an abnormal interruption is preserved in the non-volatile memory and the lost data element is reconstituted when the card is powered again.

However, this writing procedure, although more sophisticated than a simple procedure (and hence lengthier), cannot ensure the coherence of the data elements written in two different files. A simple example may be given: a debit file and a credit file are present and are linked by the fact that any increase on one side must correspond to an equal decrease on the other side.

It will be understood that there is a risk that an untimely power cut might destroy the coherence of the data elements recorded in the two files: for example, there may have been time to record the debit accurately on one side and not the credit on the other side.

Furthermore, to ensure the coherence of data elements that are not written in one and the same operation, it may be necessary to link several operations in one way or another.

OBJECTS AND SUMMARY OF THE INVENTION

It is an aim of the invention to improve the operating safety of chip cards from the viewpoint of the integrity and coherence of the data elements written in the non-volatile memory of these cards.

Accordingly, the present invention provides a method of performing memory operations in a non-volatile memory of a non-volatile memory card comprising the steps of executing a grouping instruction, performing the N successive memory operations, and determining whether the N successive memory operations are to be validated.

The grouping instruction groups together N successive memory operations for comprehensive validation, N being a finite number greater than one. For this purpose, the grouping instruction allocates a transaction space in the non-volatile memory. The transaction space is used for the storage of temporary back-up data elements corresponding to the N successive memory operations.

When the N successive memory operations in the non-volatile memory are performed, the temporary back-up data elements corresponding to each memory operation are stored in the transaction space of the non-volatile memory.

If the N successive memory operations are to be validated, then a validation instruction is executed. The validation instruction comprehensively validates the N successive memory operations.

If the N successive memory operations are not to be validated, then an invalidation instruction is executed. The invalidation instruction comprehensively invalidates the N successive memory operations. Specifically, the invalidation instruction uses the temporary back-up data elements stored in the transaction space to reconstitute the state of the non-volatile memory prior to the N successive memory operations.

Thus, it will be possible to seek the coherence of the data elements by indissolubly linking the performance of certain write operations so that, if these operations are erroneous, they can be cancelled comprehensively and not individually whereas if they are right, they will be validated comprehensively and not individually.

The present invention also provides a microprocessor-based non-volatile memory card comprising a non-volatile memory, means for receiving and executing a grouping instruction, means for performing N successive operations in the non-volatile memory, means for comprehensively validating the N successive memory operations, and means for comprehensively invalidating the N successive memory operations.

The grouping instruction groups together the N successive memory operations for comprehensive validation, N being a finite number greater than one. For this purpose, the grouping instruction allocates a transaction space in the non-volatile memory. The transaction space is allocated for the storage of temporary back-up data elements corresponding to the N successive memory operations.

In addition to the means for performing the N successive operations in the non-volatile memory, the memory card also comprises means for storing the temporary back-up data elements corresponding to each operation in the transaction space of the non-volatile memory as the N successive memory operations are performed.

The means for comprehensively validating the N successive memory operations releases memory spaces previously occupied by recordings erased or updated during the N successive memory operations. The means for comprehensively invalidating the N successive memory operations uses the temporary back-up data elements to reconstitute the state of the memory prior to the N successive operations. The validation and invalidation means are activated when the grouping instruction is received, prior to the performance of the N successive memory operations.

In practice, the grouping command may consist of the reservation of a specific non-volatile memory space (which shall be called a "transaction space") for the back-up of the data elements needed for the invalidation. The operations of addition, updating and erasure may then comprise the writing of back-up data elements in this space. The invalidation command preferably consists mainly of the use of the back-up data elements to reconstruct the state of the memory prior to the N operations. The validation command may preferably comprise only a releasing of the memory spaces previously occupied by the recordings to be erased or to be updated during the N operations.

The invention is particularly applicable to recordings made in chained files, each recording containing both a data element and a following recording address; the information elements pertaining to the chaining of recordings are placed in the transaction space during the operations for the addition, updating and erasing of these recordings.

It is very advantageous that the chaining information elements placed in the transaction space should be the former chaining information elements corresponding to the sequence of recordings before addition or updating. In this case, each operation for adding a recording preferably comprises firstly the writing, in the non-volatile memory file, of a new data element with a new chaining and, secondly, the writing in the transaction space of an information element on the addition and on the former chaining. The operation for the erasure of a recording comprises firstly the writing of a new chaining in the non-volatile memory and, secondly, the writing of an elimination information element and a former chaining information element in the transaction space. The updating of a recording comprises the addition of a recording and the release of the space previously occupied by the recording, with a corresponding modification of the chainings so that the new recording replaces the former one in the chain. The updating then comprises the writing, in the transaction space, of an information element on the former chaining as well as an updating information element.

The writing in the transaction space is preferably a writing of the type protected against untimely power cuts, namely it is done preferably with a preliminary step to back up what has to be written, then the positioning of a latch, the writing proper and the removal of the latch.

BRIEF DESCRIPTION OF THE DRAWINGS

Other features and advantages of the invention shall appear from the following detailed description made with reference to the appended drawings, of which:

FIG. 1*a–d* shows the steps that could be performed during an addition of a recording;

FIG. 2*a–d* shows the steps that could be performed during the elimination of a recording;

FIG. 3*a–d* shows the steps that could be performed during the updating of a recording.

DETAILED DESCRIPTION OF THE PREFERRED EMBODIMENT

The invention shall now be described with greater precision in relation to a simple example in which a command for the grouping of operations is associated with a command for the comprehensive validation or comprehensive invalidation of grouped operations.

The following example represents a succession of operations grouped in this way:

a) the writing in the non-volatile memory of data elements D1 and D2 in a file;

b) the selection of another file;

c) the writing in the non-volatile memory of data elements D3, D4 and D5;

d) the selection of another file;

e) the updating of the data element D2;

f) the selection of another file;

g) the erasure of the data element D1;

then, in principle, the validation of all these operations or, on the contrary, the invalidation of all the operations.

The invalidation of all the operations comprises the cancellation of the erasure of D1, cancellation of the updating of D2, cancellation of the writing of D5, D4 and D3, and finally the cancellation of the writing of D2 and D1.

An example of a situation in which all the operations are invalidated is when there is an abnormal interruption of the above operations, for example the wrenching out of the card after the step e) for the updating of D2 with a need to return to the state of the non-volatile memory that existed before the step a).

To achieve the latter possibility, it is necessary first of all that the mechanisms for writing a data element in the card should comprise means of protection against an untimely power cut during a writing operation. The general principle of such a protection system consists in placing a latch in the non-volatile memory, this latch being positioned in a specified logic state ("latched state") at the start of the performance of a write operation and being reset in its initial ("unlatched") state at the end of the operation. Moreover, information elements relating to the back-up of the data element being written are placed in the non-volatile memory before the latch is set up. When the power is turned on again, the state of the latch is routinely examined. If it is seen to be in the latched state, then it means that there has been an abnormal interruption and the back-up information elements are used to terminate the writing procedure. For example, before latching, the information to be written and the address at which it should be written will have been written in a zone of the non-volatile memory. It is only after the latch has been set up that the information is definitively written.

It will be assumed therefore that the write mechanisms are protected by latch to take account of the fact that the card may be wrenched out (or that the supply may be cut for another reason).

According to the invention, it is planned that the microprocessor of the card, which performs the sequences for the addition, updating and erasure of recordings in the file when it receives corresponding instructions from its program memory, may receive an instruction to command the grouping of write operations. When there is no such grouping command, the instructions cannot be comprehensively invalidated.

It may be planned that the grouping instruction will be capable of having its parameters set so as to enable a choice of the number N of successive operations that may be comprehensively validated or invalidated.

The instruction is designed so that its launching dictates the subsequent launching of a validation command or an invalidation command after the performance of the N operations.

The grouping command may be a command launched before each group of operations that must be validated or invalidated comprehensively. Or else, it may be a routine resident command, namely a command wherein any write, erasure or updating operation is performed solely by group of N successive operations.

The performance of the grouping instruction starts with the designation of a non-volatile memory space that shall be called the transaction space TS. In this transaction space, there will be back-up data elements necessary in the event of an invalidation of the operations or, possibly, in the event of an abnormal cut in supply to the card during the succession of N operations. Then, the performance of the grouping command modifies the write, updating or erasure sequences with reference to the sequences performed when there is no grouping command. In other words, the launching of the grouping command prompts the use of specific sub-programs of writing, erasure or updating operations for the writing, updating or erasure operations that are launched subsequently.

The memory space may be a fixed zone of a non-volatile memory. However it is preferable to arrange for this zone to vary from one group of N operations to the next one, to avoid the excessively frequent use of the same non-volatile memory zone. It is possible, for example, to arrange for the transaction space to be a space designated randomly or pseudo-randomly from among the unoccupied spaces of the memory. Or else, this space will vary according to a preset rule.

Preferably, the mechanism for writing data elements in the transaction space is a mechanism protected against abnormal power supply cuts during a write operation. The mechanism may be a latched mechanism as described here above.

It shall be assumed hereinafter that the recordings of the non-volatile memory are organized in chained files.

Preferably, for any operation for the addition of a new recording to the file that comprises the designation of a new memory space used and the creation of a chaining, the write sequence performed is the following: First, the chaining corresponding to the state of the memory before the performance of the sequence for the addition of a recording is stored in the transaction space. Then, the writing proper of the new recording (data and chaining) is performed. An information element on the addition of a recording at a given address is also stored in the transaction space.

For any operation for the updating of a recording that comprises the modification of a chaining with the designation of a new memory space and the release of a former memory space and the recording of a data element and of a chaining in the new space, the updating sequence performed is the following: First, the data element and the chaining corresponding to the state of the memory before updating are stored in the transaction space. Also, an information element on an addition of recording and an information element on an elimination of recording are stored. Finally, the updating (data and chaining) is performed.

For any recording erasure operation that comprises the release of a memory location and the modification of a chaining, the erasure sequence performed is the following: First, the former chaining and an information element on the location of the modified recording are stored in the transaction space. Then, the chaining is modified.

After the performance of a sequence of N different operations, three cases may arise:

It is necessary to validate the sequence of operations. The transaction space is then gone through. Its contents are analyzed and the non-volatile memory locations occupied by the recordings that were to be erased or updated during the sequence of N operations are declared to be unoccupied. This consists in the zero setting (if a 0 bit indicates an unoccupied location and a 1 bit an occupied location) of one or more corresponding bits of a file allocation table representing the occupancy of the non-volatile memory. The chainings and data elements of new recordings added during the addition or updating operations are already recorded in the memory.

or else, it is necessary to invalidate the sequence of operations, for example because a manual error has been committed or for any other reason. The transaction space is again examined by tracing back the chronological sequence of operations performed. The contents of this space are analyzed and the new memory locations occupied by the recordings made during the addition and updating operations are declared to be free (with a zero setting of bits in the file allocation table) and the former chains are gradually restored on the basis of values preserved for each operation in the transaction space.

Finally, the last possibility is the case where an abnormal power supply cut has taken place during the sequence of N operations. First of all, powering of the card again will validate the detection of a latch in the latched state. The data that might have been inaccurately recorded in the transaction space will be restored. Then exactly the same procedure will be used as in the case of a invalidation, the sequence of operations having to be comprehensively cancelled if an abnormal cut has taken place.

Whatever may be the operation performed (validation or invalidation), the transaction space may then be released.

In short, three specific commands are used. The first command notifies the creation of a transaction space at the same time as it reinforces the process of indivisibility of N successive addition, erasure or updating operations. The second command enables the validation of all the actions whose chronological sequence is preserved in the transaction space, and the third command enables the invalidation of all the actions whose chronological sequence is preserved in the transaction space.

In the preferred technique chosen, the transaction space stores the former chainings but the new recordings and chainings are already recorded in the memory before the validation. This is why it is necessary to prohibit any read operation in the memory so long as the validation command is not performed, otherwise there is a risk of that as yet non-validated information elements may be read.

Additional techniques of protection against different operational defects may be used in the context of the invention. For example, it is possible to take precautions against writing operations in the memory that are unsuccessful because of a deterioration of this memory: for this purpose, the incriminated recording is shifted when there is an unsuccessful writing of a chaining.

It will be noted that the transaction space used to back up data elements needed to reconstruct the previous context of the memory is small-sized. Each write operation essentially requires the preserving of a pair constituted by an address and a data element. Furthermore, this pair may be written and read by only one port of access to the non-volatile memory. This limits the amount of time taken up by the special writing procedures used according to the invention.

The choice of writing the former chainings and recorded data elements in the transaction space after having written the new data elements in the non-volatile memory makes it possible to reduce the total time needed for writing and validation to the minimum. The total time would be greater if the final data elements to be written rather than the former data elements were to be stored in the transaction space.

Indeed, the validation is somewhat anticipated in the preferred example chosen herein: the validation is done in two steps. For each command, the first step consists in carrying out the desired chainings and preserving the previous values (address/data pair). The second step, performed later, is the step of final validation of all the operations. The memory locations that have become unused are then released. Should the validation mechanism not be chosen, the commands for the writing of data elements in the non-volatile memory would have effected substantially the same number of operations, namely: the setting up of chainings and then the release of the memory spaces occupied by recordings to be erased or updated. The time taken for writing in the transaction space should therefore be added to the time taken to carry out this command (in the case of a validation operation) to obtain the total time of performance per command.

DETAILED ILLUSTRATIVE EXAMPLE

For a clearer understanding of the mechanisms brought into play in the method according to the invention, FIGS. 1, 2 and 3 respectively show operations for the addition, erasure and updating of recordings.

Each figure shows the state of the file before the operation, after the operation, after validation and after invalidation.

The figures show recordings with their numbers (for example E10 for the tenth recording), their address (for example A10 for the address of the tenth recording), their contents comprising firstly a chaining value that is the address of the next recording and secondly a data element (D10 for the tenth recording). The contents of the file allocation table (FAT) at the location corresponding to each recording address have also been shown. Contents represented by "1" mean that the location is occupied. Contents represented by "0" mean on the contrary that the location is unoccupied.

Finally, the transaction space TS with the information elements that it will contain after each operation has been shown.

FIG. 1: addition of recording E11 after the last recording E10 of the file.

a) Before addition, the state of the file is as follows: The chaining recorded in E10 at the address A10 is an end-of-file (EOF) indication. The location A10 is allocated ("1" in the FAT table); the location A11 is free ("0" in the FAT table).

b) After the addition operation: the address A11 is allocated ("1" in the table). The chaining is modified in E10 (A11 is indicated as the next recording address). A chaining (end-of-file EOF) and a data element (D11) are recorded at the address A11 to form the added recording E11. At the same time, the following information elements are stored in the transaction space: added recording, the former EOF chaining in the recording E10 at the address A10.

c) Validation operation: it must be understood that the validation takes place only after several operations (additions, erasures and updating) but to provide for an easy understanding of the working of the invention, it is assumed that the validation is immediate (and similarly so if it is a invalidation operation). It can be seen in FIG. 1, (part c) that the validation changes nothing in the state of the file nor in the FAT table as compared with their state immediately after the addition operation. It is therefore ascertained that a sort of anticipated validation operation has been truly performed.

d) Invalidation operation instead of a validation operation: an examination of the transaction space reveals an addition of a recording. It is known that the added recording is the recording A11 that contains an end-of-file indication EOF. The bit corresponding to the address A11 is set at zero in the FAT table, releasing the location A11. Furthermore, the former chaining recorded in the transaction space is restored. The end-of-file EOF indication is reset in the recording at the address A10.

The initial state of the file is therefore restored by the invalidation action.

FIG. 2: the erasure of a recording E3 between two recordings E2 and E4.

a) Before erasure of E3, the state of the file is as follows: addresses A2, A3, A4 occupied ("1" in the FAT table for each) respectively by recordings E2, E3, E4, chainings recorded in the recordings: A3/A2 (A3 in the recording E2 at the address A2), A4/A3 and A5/A4; data elements D2, D3, D4 in the recordings E2, E3, E4 respectively.

b) After the erasure operation (not yet validated): the chainings are modified. A4 is indicated as the next recording address in the recording E2. At the same time, the transaction space records the following information elements: operation of elimination, and former chaining: A3/A2. The allocation table FAT is not modified at this state.

c) Validation: the transaction space is examined and shows an erasure operation at the address A3. The bit corresponding to A3 is therefore set at zero in the FAT table to release the location at the address A3. The file is modified and takes account of the elimination of the recording E3.

d) Invalidation: the transaction space is examined and shows an elimination and a former chaining A3/A2 which indicates that the erased recording is A3. This former chaining is restored by replacing the address A3 in the recording E2 located at the address A2. No action is taken on the file allocation table which had not been modified during the elimination of a recording. The file is recovered in the initial state.

FIG. 3: updating of the recording E7 between two recordings E6 and E8.

a) Before the updating, the state of the file is as follows: recording E6 at the address A6 comprising a chaining towards the address A7 and a data element D6, with "1" in the file allocation table since the address is used. The recording E7 at the address A7 comprising a chaining towards an address A8 and a data element D7, and "1" in the FAT table. An available address A12 ("0" in the allocation table) is also shown.

b) The updating consists of the use of the address A12 for the placing therein of a data element D'7 to replace the data elements D7 and to modify the chainings so that the recording E'7 at the address A12 replaces the recording E7 at the address A7 in the rest of the chained recordings. After updating, the file allocation table has "1s" at the locations corresponding to the addresses A6, A7 and A12. The recording at the address A6 now has a chaining towards the address A12 (A12/A6) and no longer A7. The recording E'7 at the address A12 comprises a chaining towards the address A8 so that it completely replaces the recording E7 in the chain. The transaction space has recorded the existence of an updating with a former chaining A7/A6 (address A7 in the recording at the address A6).

c) Validation operation: the transaction space shows an updating with a former chaining A7/A6. This means that the recording has to be eliminated at A7, and this dictates the setting at "0" of the bit corresponding to A7 in the allocation table, thus releasing the memory space at this address.

d) Invalidation operation: the transaction space reveals an updating operation with a former chaining A7/A6. This means that it is necessary to examine the contents at the address A6, find therein the address of the chaining recorded therein (A12) and then eliminate the recording at the address A12 (E'7). A bit "0" is therefore placed in the allocation table at the position corresponding to the address A12. At the same time, the former chaining is restored, i.e. the address A7 is replaced in the contents of the recording E6 at the address A6. Furthermore, since the contents A8+D7 at the former address A7 have not been modified, the recording E7 is intact. The bit of the allocation table at A7 had furthermore remained at "1". The initial state has truly been returned to.

The examples thus described in detail clearly show that each operation uses only a small memory space TS. The transaction space which may change its position at each new series of N operations is therefore small-sized and the duration of sequences is limited.

It will be noted that the figures have not shown the erasure of information elements from the transaction space after each validation or invalidation operation.

I claim:

1. A method of performing memory operations in a non-volatile memory of a non-volatile memory card, the method comprising:

(A) executing a grouping instruction, the grouping instruction grouping together a number N of successive memory operations for comprehensive validation, the number N being a finite number greater than one, the number N being a parameter of the grouping instruction such that the number of successive memory operations which are grouped together is variable and is determined when the grouping instruction is executed, the grouping instruction allocating a transaction space in the non-volatile memory, the transaction space being allocated for the storage of temporary back-up data elements corresponding to the N successive memory operations; then (B) (1) performing the N successive memory operations in the non-volatile memory, and (2) storing the temporary back-up data elements corresponding to each memory operation in the transaction space of the non-volatile memory, the steps (B)(1) and (B)(2) occurring substantially simultaneously; then (C) determining whether the N successive memory operations are to be validated, and if the N successive memory operations are to be validated, then executing a validation instruction, the validation instruction comprehensively validating the N successive memory operations, and if the N successive memory operations are not to be validated, then executing an invalidation instruction, the invalidation instruction comprehensively invalidating the N successive memory operations, the invalidation instruction using the temporary back-up data elements stored in the transaction space to reconstitute the state of the non-volatile memory prior to the N successive memory operations.

2. A method according to claim 1, wherein the recordings of the non-volatile memory are recorded in chained files, each chained file comprising a data element and a chaining element, the chaining element being an address of a next chained file;

wherein the N successive memory operations alter the chaining elements of the chained files from former chaining elements to new chaining elements; and wherein the temporary back-up data elements relate to the former chaining elements.

3. A method according to claim 1, wherein the recordings in the memory are organized in a sequence of chained files, each chained file comprising a data element and a chaining element, the chaining element being an address of a next chained file in the sequence of chained files; and wherein the N successive memory operations each comprise altering the chaining element of a particular chained file from a former chaining element to a new chaining element.

4. A method according to claim 3, wherein one of the N successive memory operations is an adding type of memory operation, the adding type of memory operation comprising the steps of writing a new data element and the new chaining element in the non-volatile memory, and writing a temporary back-up data element regarding the former chaining element in the transaction space.

5. A method according to claim 3, wherein one of the N successive memory operations is an erasing type of memory operation, the erasing type of memory operating comprising the steps of writing of the new chaining element in the non-volatile memory, and writing of the former chaining element in the transaction space.

6. A method according to claim 3, wherein one of the N successive memory operations is an updating type of memory operation, the updating type of memory operation comprising the steps of adding a new recording and releasing a memory space occupied by a former recording, modifying the chaining elements of the sequence of chained files so that the new recording replaces the former recording in the chained files, and wherein the temporary back-up data elements stored in the transaction space correspond to the chaining elements of the sequence of chained files before the modifying step is performed.

7. A method according to claim 1, wherein the writing in the transaction space is protected against untimely power cuts.

8. A method according to claim 1, wherein one of the N successive memory operations is an erasing type of memory operation, and wherein the validation instruction releases a memory space previously occupied by a recording erased during the N successive memory operations.

9. A method according to claim 1, wherein one of the N successive memory operations is an updating type of memory operation, and wherein the validation instruction releases a memory space previously occupied by a recording erased during the N successive memory operations.

10. A microprocessor-based non-volatile memory card comprising:

(A) a non-volatile memory;

(B) means for receiving and executing a grouping instruction, the grouping instruction grouping together a number N of successive memory operations for comprehensive validation, the number N being a finite number greater than one, the number N being a parameter of the grouping instruction such that the number of successive memory operations which are grouped together is variable and is determined when the grouping instruction is executed, the grouping instruction allocating a transaction space in the non-volatile memory, the transaction space being allocated for the storage of temporary back-up data elements corresponding to the N successive memory operations;

(C) (1) means for performing the N successive operations in the non-volatile memory after the grouping instruction is executed, and (2) means for storing the temporary back-up data elements corresponding to each operation in the transaction space of the non-volatile memory, the temporary back-up data elements being stored as the N successive memory operations are performed;

(D) (1) means for comprehensively validating the N successive memory operations, the validation means releasing memory spaces previously occupied by recordings erased or updated during the N successive memory operations, and (2) means for comprehensively invalidating the N successive memory operations, the invalidation means using the temporary back-up data elements to reconstitute the state of the memory prior to the N successive operations, and the validation and invalidation means being activated when the grouping instruction is received, prior to the performance of the N successive memory operations.

11. A microprocessor-based non-volatile memory card according to claim 10, wherein the recordings of the non-volatile memory are recorded in chained files, each chained file comprising a data element and a chaining element, the chaining element being an address of a next chained file;

wherein the N successive memory operations alter the chaining elements of the chained files from former chaining elements to new chaining elements; and wherein the temporary back-up data elements relate to the former chaining elements.

12. A microprocessor-based non-volatile memory card according to claim 10, wherein the recordings in the memory are organized in a sequence of chained files, each chained file comprising a data element and a chaining element, the chaining element being an address of a next chained file in the sequence of chained files; and wherein the N successive memory operations each comprise altering the chaining element of a particular chained file from a former chaining element to a new chaining element.

13. A microprocessor-based non-volatile memory card according to claim 12, wherein one of the N successive memory operations is an adding type of memory operation, and wherein the adding type of memory operation comprises writing a new data element and the new chaining element in the non-volatile memory and writing a temporary back-up data element regarding the former chaining element in the transaction space.

14. A microprocessor-based non-volatile memory card according to claim 12, wherein one of the N successive memory operations is an erasing type of memory operation, and wherein the erasing type of memory operation comprises writing of the new chaining element in the non-volatile memory and writing of the former chaining element in the transaction space.

15. A microprocessor-based non-volatile memory card according to claim 12, wherein one of the N successive memory operations is an updating type of memory operation, wherein the updating type of memory operation comprises adding a new recording and releasing a memory space occupied by a former recording and modifying the chaining elements of the sequence of chained files so that the new recording replaces the former recording in the chained files, and wherein the temporary back-up data elements stored in the transaction space correspond to the chaining elements of the sequence of chained files before the modification is performed.

16. A microprocessor-based non-volatile memory card according to claim 10, wherein the writing in the transaction space is protected against untimely power cuts.

17. A method of performing memory operations in a non-volatile memory of a non-volatile memory card, recordings of the non-volatile memory being recorded in a sequence of chained files, each chained file comprising a data element and a chaining element, the chaining element being an address of a next chained file, the sequence of chained files thereby being linked by a sequence of chaining elements, the method comprising:

(A) executing a grouping instruction, the grouping instruction grouping together a number N of successive memory operations for comprehensive validation, the number N being a finite number greater than one, the grouping instruction allocating a transaction space in the non-volatile memory, the transaction space being allocated for the storage of temporary back-up data elements corresponding to the N successive memory operations, the number N being a parameter of the grouping instruction such that the number of successive memory operations which are grouped together is variable and is determined when the grouping instruction is executed; then (B) (1) performing the N successive memory operations in the non-volatile memory, including the steps of modifying the sequence of chained files from a former sequence of chained files to a new sequence of chained files, and modifying the sequence of chaining elements to replace a plurality of former chaining elements with a plurality of new chaining elements, and (2) storing the temporary back-up data elements corresponding to each memory operation in the transaction space of the non-volatile memory, the temporary back-up data elements including the plurality of former chaining elements, the steps (B)(1) and (B)(2) occurring substantially simultaneously; then (C) determining whether the N successive memory operations are to be validated, and if the N successive memory operations are to be validated, then executing a validation instruction, the validation instruction comprehensively validating the N successive memory operations, the validation instruction releasing memory spaces used by the former sequence of chained files but not used by the new sequence of chained files, and if the N successive memory operations are not to be validated, then executing an invalidation instruction, the invalidation instruction comprehensively invalidating the N successive memory operations, the invalidation instruction using the temporary back-up data elements stored in the transaction space to reconstitute the state of the non-volatile memory prior to the N successive memory operations.

* * * * *